United States Patent

Razeghi

[11] Patent Number: 5,384,151
[45] Date of Patent: Jan. 24, 1995

[54] INGAASP/GAAS DIODE LASER

[75] Inventor: Manijeh Razeghi, Wilmette, Ill.

[73] Assignee: Northwestern University, Evanston, Ill.

[21] Appl. No.: 132,561

[22] Filed: Oct. 6, 1993

Related U.S. Application Data

[63] Continuation-in-part of Ser. No. 105,379, Aug. 11, 1993.

[51] Int. Cl.$^6$ ............................................. C23C 16/00
[52] U.S. Cl. .................................... 427/58; 427/124; 427/255.2; 427/255.7
[58] Field of Search ................... 427/58, 124, 255.2, 427/255.7

[56] References Cited

U.S. PATENT DOCUMENTS

| | | | |
|---|---|---|---|
| 3,364,084 | 1/1968 | Ruehrwein | 437/126 |
| 3,663,320 | 5/1972 | Maruyama | 427/255.2 |
| 4,340,966 | 7/1982 | Akiba et al. | 372/45 |
| 4,368,098 | 1/1983 | Manasevit | 156/606 |
| 4,382,265 | 5/1983 | Pearsall | 239/271 |
| 4,404,265 | 9/1983 | Manasevit | 428/689 |
| 4,479,222 | 10/1984 | Hawrylo | 372/45 |
| 4,569,721 | 2/1986 | Hayakawa et al. | 156/649 |
| 4,804,639 | 2/1989 | Yablonovitch | 437/129 |
| 4,902,356 | 2/1990 | Noguchi et al. | 148/334 |
| 5,093,278 | 3/1992 | Kamei | 437/129 |
| 5,145,792 | 9/1992 | Hirata | 437/129 |
| 5,173,447 | 12/1992 | Ijichi et al. | 437/129 |
| 5,222,090 | 6/1993 | Serreze | 372/45 |

OTHER PUBLICATIONS

D. Z. Garbuzor et al "High-Power 0.8 μm InGaAs-P-GaAs SCHSQW Lasers" IEEE Journal of Quantum Electronics vol. 27, No. 6, Jun. 1991 pp. 1531–1535.

"Recent Advances on GaAs-GAInP Multiquantum Wells Grown in MOCVD on GaAs, InP And Silicon Substrates," Omnes, F. et al., Thomson CSF LCR, (91404 Orsal Cedex, France), pp. 15–36. No month, year.

"Low–Pressure Metallo-Organic Chemical Vapor Deposition of $Ga_xIn_{1-x}As_yP_{1-y}$Alloys," Razeghi, M., Semiconductors and Semimetals, vol. 22, Part A, pp. 299–378. No month, year.

"Growth Technology," Razeghi, M., The MOCVD Challenges, vol. 1, A Survey of GaInAsP-InP for Photonic and Electronic Applications, (Bristol: Adam Hilger), pp. 3–17. No month, year.

"GaInAsP-InP System: MOCVD Growth, Characterization and Application," Razeghi, M., The MOCVD Challenges, vol. 1, A Survey of GaInAsP-InP for Photonic and Electronic Applications, (Bristol: Adam Hilger), pp. 165–215. No month, year.

Primary Examiner—Shrive Beck
Assistant Examiner—Vi Duong Dang
Attorney, Agent, or Firm—Welsh & Katz, Ltd.

[57] ABSTRACT

High power diode lasers of the formula GaInP/InGaAsP on GaAs substrates which operate at powers up to 5.3W with increased power levels and efficiencies are disclosed. By increasing the thickness of the optical cavity of the heterostructure and by doping to a level of $10^{20}$ atoms/cm$^3$ the cap layer surface with a p-type dopant such as diethyl zinc, increased power at an increased efficiency level is observed.

10 Claims, 2 Drawing Sheets (a)

INGAASP/GAAS DIODE LASER

This invention was made with Government support under Grant No. DAAH-04-93-G-0044 awarded by the Advanced Research Projects Agency. The Government has certain rights in the invention.

This application is a continuation-in-part of U.S. Ser. No. 105,379, filed Aug. 11, 1993.

This application relates to semiconductor III-V alloy compounds, and more particularly to a method of making III-V alloy compounds for use in diode lasers.

BACKGROUND OF THE INVENTION

The growth of semiconductor III-V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III-V alloys. The process requires only one high-temperature zone for the in situ formation and growth of the semiconductor compound directly on a heated substrate.

FIG. 2 shows the x-y compositional plane for quaternary III-V alloys matched to an InP substrate at 300 K. The x-y coordinate of any point in the plane gives the compositions of the alloys. The curved contour lines correspond to curves of constant energy gap ($E_g$). The straight black contour lines correspond to curves of constant lattice parameters. The black line labeled GaInP corresponds to alloys having a lattice constant matching that of GaAs 5.653 Å. The cross-hatched region corresponds to alloys having indirect band gaps.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow $Ga_xIn_{1-x}As_yP_{1-y}$ ($0 \leq x \leq 0.47$ and $0 \leq y \leq 1$) lattice matched to InP for the complete compositional range between InP ($\lambda=0.91$ $\mu$m, $E_g=1.35$ eV) and the ternary compound $Ga_{0.47}In_{0.53}As$ ($\lambda=1.67$ $\mu$m, $E_g=0.75$ eV). GaInAsP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD.

The disadvantages of LPE include growth problems with GaInAsP alloys for $\lambda > 1.4$ $\mu$m and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of GaInAsP layers of uniform thickness and composition that is lattice matched to GaAs over areas of more than 10 cm². This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases. In contract to LPE growth, it has been found that during MOCVD growth of a double heterostructure, GaAs can be grown directly on GaInAsP with no disturbance of the active layer, i.e., there is no effect equivalent to melt-back.

One of the key reasons for the usefulness of this method is the possibility of obtaining high-purity and therefore high-mobility $Ga_xIn_{1-x}As_yP_{1-y}$. As long-wavelength 1.0–1.65 $\mu$m GaInAsP electro-optical devices become more widely used, motivated by low fiber absorption and dispersion, high transmission through water and smoke, and greatly enhanced eye safety at wavelengths greater than 1.4 $\mu$m, LP-MOCVD offers the advantages of smooth uniform surfaces, sharp interfaces (lower than 5 Å for GaInAsP/GaAs), uniformly lower background doping density, and economy of scale for large-area devices.

Recent studies have shown the feasibility of using InGaAsP/GaAs heterostructures as diode lasers. The diodes can be used successfully for solid state laser pumping and can be interchanged with lasers based on AlGaAs/GaAs heterostructures.

Laser diodes emitting at 808 nm wavelength are important sources for the pumping of YAG:Nd lasers. AlGaAs/GaAs lasers are commonly used for this purpose, but there are several problems with these structures: Oxidation of AlGaAs layers which makes further regrowth and device fabrication difficult; higher growth temperature which may not be compatible with monolithic integration; and the presence of dark line defects and dislocation migration which can cause degradation in performance. Most of these problems can be attributed to the presence of Aluminum. High-power quantum well lasers based on liquid phase epitaxy (LPE) grown GaInAsP/GaAs structures do demonstrate characteristics competitive to the best existing AlGaAs/GaAs separate confinement heterostructure-single quantum well (SCH-SQW) lasers but, as stated above, growth by LPE present several major disadvantages.

SUMMARY OF THE INVENTION

An object, therefore, of the invention is the growth of high quality $Ga_xIn_{1-x}As_yP_{1-y}$ ($\lambda$ between 0.7 micron up 1.1 micron, including 0.808 micron /GaAs double heterostructures by low pressure metallorganic chemical vapor deposition (LP-MOCVD).

A further object of the subject invention is a double heterojunction laser structure grown with strained layer quantum wells.

A still further object of the subject invention is a method of increasing the power capabilities of a diode laser by increasing the width of the optical cavity of the heterostructure.

A still further object of the subject invention is a method of increasing the power capacity of a diode laser by doping a contact layer of a heterostructure for use in a diode laser so as to include maximum volume percentage of dopant atoms in the surface.

These and other objects are attained by the subject invention wherein SCH-SQW (separate confinement heterostructure, single quantum well) diode lasers of the formula GaInP/InGaAsP on GaAs substrates which operate at powers up to 5.3W with emitting apertures of 100 microns are prepared with optical cavities of from 5000 Å to 1 micron, and a p-type dopant incorporated in minimum quantities in the infringement layer thereby increasing quantum efficiency and power of the laser.

DETAILED DESCRIPTION OF THE INVENTION

Figure 2:
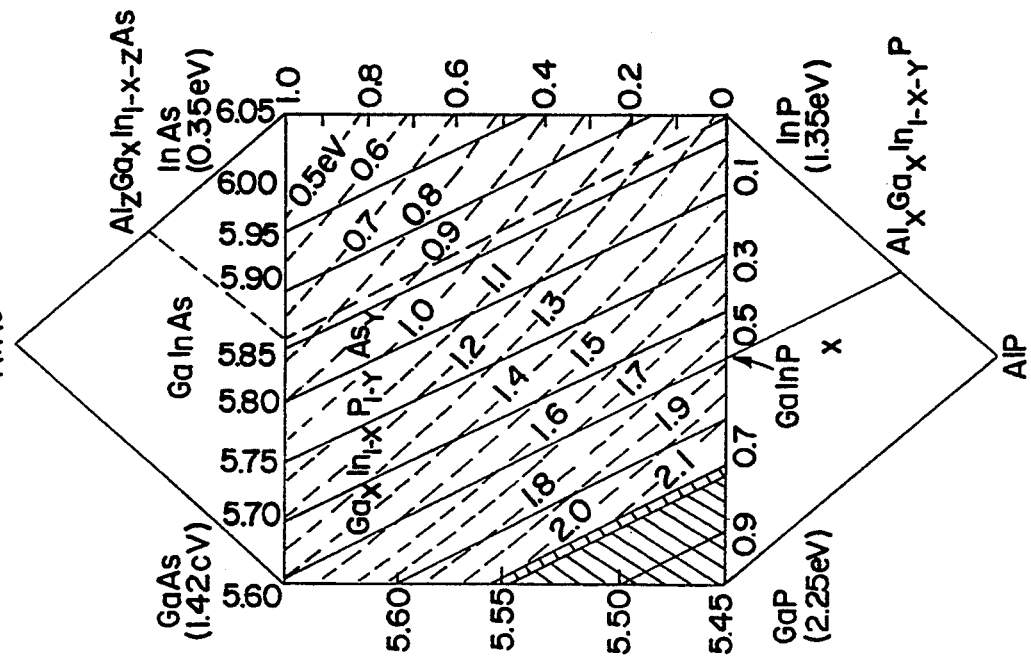
FIG. 2 is a plot of the compositional plane for quaternary III-V alloys matched to an InP substrate.

The reactor and associated gas-distribution scheme used herein shown in FIG. 2. The system consists of a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a nitrogen flow of 4 liters min$^{-1}$, and the working pressure of 75 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 arm on the gas panel, thereby ensuring reproducibility of flow-rate measurements.

The gas source used in this study for the growth of GaInAsP by LP-MOCVD are listed in the accompanying tabulation.

| Group-III Sources | Group-V Sources |
| --- | --- |
| Ga(C$_2$H$_5$)$_3$ | AsH$_3$ |
| In(CH$_3$)$_3$ | PH$_3$ |

The organometallic group-III species trimethyl indium (TMI) and triethyl gallium (TEG) are contained in stainless steel bubblers, which are held in controlled temperature baths at 31 and 0° C., respectively. An accurately metered flow of purified H$_2$ for TMI and TEG is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted arsine (AsH$_3$) and pure phosphine (PH$_3$) are used as sources of As and P, respectively. The metal alkyl or hydride flow can be either injected into the reactor or into the waste line by using two-way valves. In each case, the source flow is first switched into the waste line to establish the flow rate and then switched into the reactor. The total gas flow rate is 8 liters min$^{-1}$. Stable flows are achieved by the use of mass flow controllers.

Semi-insulating or n$^+$substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 μm from each side. The wafers were then mechanochemically polished in a solution of 1.5% bromine in methanol, removing a further 80–100 μm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n$^+$tin-doped substrate and a semi-insulating iron-doped substrate were generally used for each experiment.

The epitaxial layer quality is sensitive to the pretreatment of the substrate and the alloy composition.

Pretreatment of the substrates prior to epitaxial growth was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;
4. Dipping in 3% Br$_2$ in methanol at room temperature for 3 minutes (ultrasonic bath);
5. Rinsing in hot methanol;
6. Dipping in H$_2$SO$_4$ for 3 minutes;
7. Rinsing in deionized H$_2$O, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 500° and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

Figure 1:
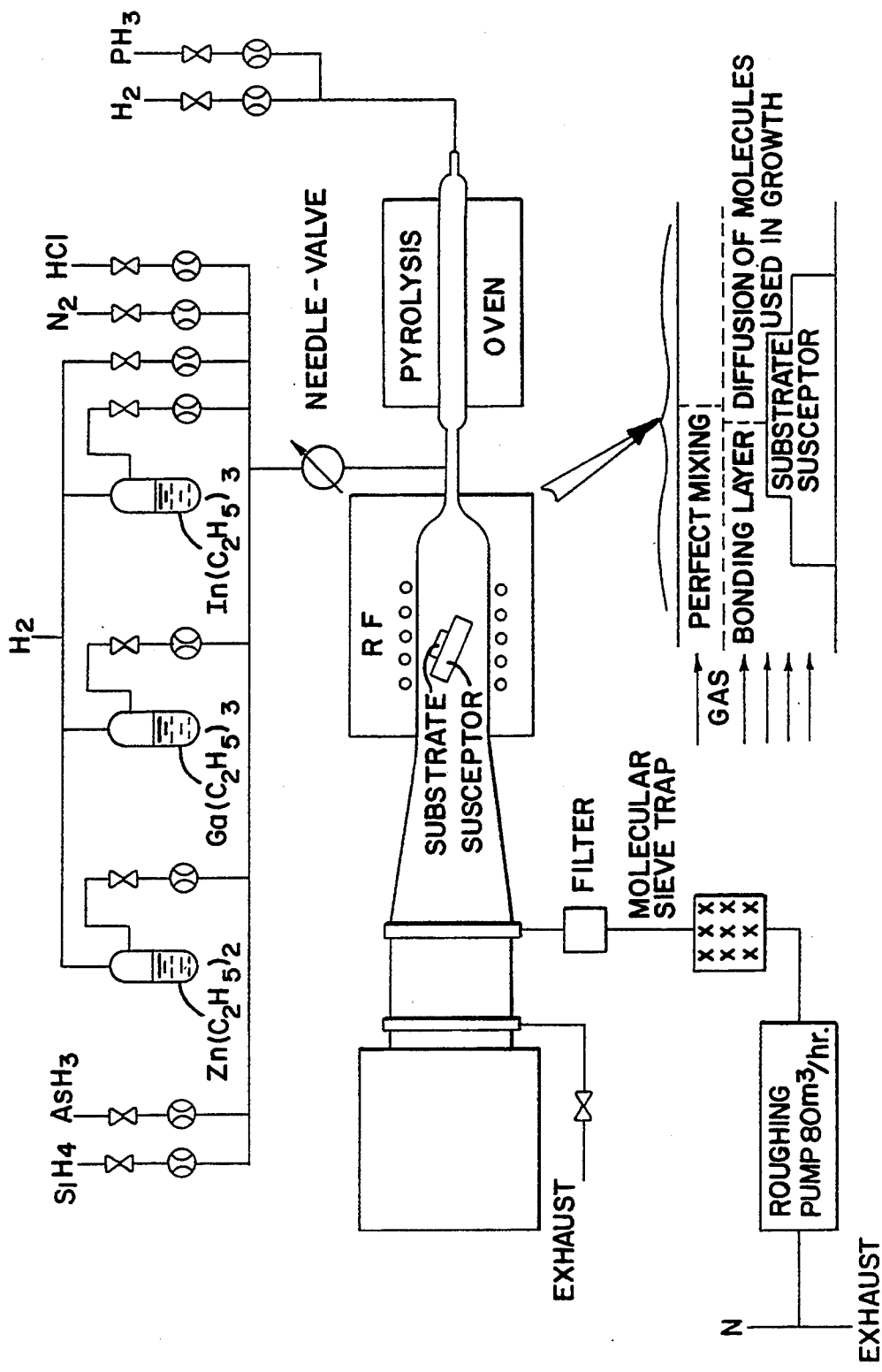
FIG. 1 is a schematic diagram of the LP-MOCVD reactor for use in the method of the subject invention.

High quality GaInAsP/GaAs may be grown in the method of the subject invention by low pressure metallorganic chemical vapor deposition (LP-MOCVD). The layers of the heterostructure are grown by the induction-heated horizontal cool wall reactor of FIG. 1, as described below in more detail. Trimethylindium (TMI) and triethylgallium (TEG) are used as the sources of Indium and Gallium. Pure and diluted arsine (AsH$_3$) and phosphine (PH$_3$) supplied by Matheson Inc. are used as As and P sources. Sample is grown on a (001) GaAs substrate with 2 degree misorientation toward <110>, thus giving rise to a strained layer quantum well. The optimum growth conditions are listed in Table 1.

Doping is conducted with diethyl zinc (DEZ) for p-type doping and silane (SiH$_4$) or H$_2$S for n-type doping. Doping is performed through the DEZ bubbler shown in FIG. 1 with H$_2$ as carrier gas and at temperatures from $-15°$ C. to ambient temperatures at 20–90 cm$^3$ min.$^{-1}$ and onto either a hot or cooled substrate (535° C.). SiH$_4$ or H$_2$S may be simply directed at ambient temperatures onto the hot substrate at 20–90 cm$^3$ min.$^{-1}$.

It has been found that maximum or saturation p-type doping is required on the top cladding or confinement layer surface for maximum power levels to be achieved in a laser.

In a preferred doping method for incorporating the maximum amount of dopant on a layer, once the layer to be doped is fully grown, the heat source is terminated and the substrate and grown layers allowed to cool; the metal and hydride sources are terminated; the dopant flow, for instance DEZ, is initiated at the temperatures indicated for diffusion onto the cooled substrate/epilayer which has been previously grown. After about 2–3 minutes, the dopant flow is terminated and the next epilayer grown. By this method, it is found that from $5 \times 10^{19}$ to $10^{20}$ atoms/cm$^2$ of Zn may be placed on the top surface of the confinement layer for saturation doping.

TABLE 1

Optimum growth conditions of GaInP/GaInAsP-/GaInP/GaAs structure.

|  | GaAs | GaInP | GaInAsP |
| --- | --- | --- | --- |
| Growth Pressure (Torr) | 76 | 76 | 76 |
| Growth Temperature (°C.) | 535 | 535 | 535 |
| Total H$_2$ Flow (liter/min) | 3 | 3 | 3 |
| AsH$_3$ (cc/min) | 30 | — | 20 |
| TMI (cc/min) | — | 200 | 150 |
| TEG (cc/min) | 120 | 120 | 120 |
| PH$_3$ (cc/min) | — | 300 | 200 |
| Growth Rate (Å/min) | 150 | 300 | 250 |

The GaAs layers can be grown at 76 Torr and low temperature, between 500° and 600° C., by using TEG and arsine (AsH$_3$) in a H$_2$ or N$_2$ or H$_2$+N$_2$ carrier gas.

Layers of InGaP can be grown at 76 Torr and low temperature, between 500° and 600° C., using TEI or TMI, TEG, and ASH$_3$ in an H$_2$ or N$_2$ or H$_2$+N$_2$ carrier gas. Uniform composition In0.49Ga0.51P:Zn over an area of 10 cm$^2$ of GaAs substrate has been obtained. GaAs-InGaP interfaces can be obtained by turning off the arsine flow and turning on both the TMI and the PH$_3$. InGaP-GaAs interfaces can be obtained by turning off the PH$_3$ and TMI flow and turning on the AsH$_3$ flow. The growth rate is small (~3 Å sec$^{-1}$), and it takes less than 1 second for a gas flow to reach its new steady state.

The thickness of an epilayer was measured by a bevel stain technique (solution) and the composition calculated either from the photoluminescence wavelength or from the value of the lattice parameter as measured by single-crystal x-ray diffraction. The waveguide layers and active layers of InGaAsP are grown as follows.

For GaInAsP ($\lambda = 1.3$ μm), one obtains the ratio of partial pressure of $$P_P/P_{As} = (1-y)/y \approx 20,$$

$$P_{In}/P_{Ga} = (1-x)/x \approx 3,$$

$$P_{(As+P)}/P_{(In+Ga)} \approx 600.$$

Thus, with a growth temperature of 650° C. and total flow rate of 7 liters min$^{-1}$, one can obtain Ga$_x$In$_{1-x}$As$_y$P$_{1-y}$ epitaxial layers with different compositions between GaAs (x=0, y=0) and GaInAs (X=0.47, y=1).

After optimization of growth conditions for GaAs and InGaAsP layers, LP-MOCVD has been successfully used for the growth of GaInAsP/GaAs double heterostructure layers, for laser application emitting at 0.7 micron up to 1.1 micron. The various interfaces were produced by controlling the flow of the relevant component, as in the case of GaInAs mentioned previously.

The growth rate for these quaternary materials was small (as was the case for the ternary materials) (~3 Å sec$^{-1}$), and the gas flow stabilized to its new steady-stable value in less than 1 second after switching. The thickness of the quaternary layers can be varied as desired to reach an overall thickness of the optical cavity of from 5000 Å to 1.0 micron.

Wafers grown as set forth above were lapped to a thickness of 100 μm and Au - 12% Ge and Au 8% Zn contact metallizations were deposited on the n and p sides, respectively. The contacts were then annealed at 400° C. for 5 minutes in an argon ambient. The devices were cleaved and sawn, producing chips of width 150 μm with cavity lengths in the range 300–1000 μm. The laser chips were tested, unmounted under pulsed conditions at a pulse repetition rate of $10^4$ Hz with a pulse length of 100 nsec. For chips cleaved from the same bar, the standard deviation in the lasing threshold current density was only ±5%. For a large slice area (10 cm2), the standard deviation in lasing threshold was typically less than 20%.

EXAMPLE 1

A double heterostructure for a diode laser as set forth in FIG. 3 was prepared on a GaAs substrate according to the above methods and in the following manner. First, a 1-μm thick InGaP layer (n=1×10$^{18}$) confinement layer doped with Si; a 0.2 micron waveguide layer of In$_{0.43}$Ga$_{0.57}$As$_{0.15}$P$_{0.85}$, and a 300 Å thick undoped In$_{0.13}$Ga$_{0.87}$As$_{0.75}$P$_{0.25}$ active layer (800 nm wavelength composition), over a 0.2 micron-thick In$_{0.43}$Ga$_{0.57}$As$_{0.15}$P$_{0.85}$ waveguide layer (0.65 micron wavelength composition) were successively grown by LP-MOCVD on a Si-doped (100) 2° off GaAs substrate. Total thickness of the optical cavity was 4300 Å. The growth temperature was 530° C. The above layers were then covered with 1 micron of Zn-doped In$_{0.49}$Ga$_{0.51}$P (the cladding layer) and a 0.1 micron GaAs cap layer with Zn doping of $10^{20}$ atoms/cm$^3$. p-type doping of the cladding layer was conducted prior to deposition of the cap layer by directing DEZ at 535° C. into the reactor for about 3 minutes to deposit $5 \times 10^{17}$ Zn atoms/cm$^3$. After deposition of the cap layer and in order to have a good ohmic contact and to achieve a concentration of $10^{20}$ Zn atoms/cm$^3$ in the cap layers, the TEG flow is switched off and the temperature is allowed to cool down to room temperature; this takes about 10 minutes. While cooling, the DEZ and arsine flow remain constant. When ambient temperature is reached the DEZ and arsine flow are turned off. The resulting laser diode exhibited a wavelength of $\lambda = 808$ nm. A threshold current density of 400 A/cm$^2$ with a differential quantum efficiency of 70% was observed.

Figure 3:
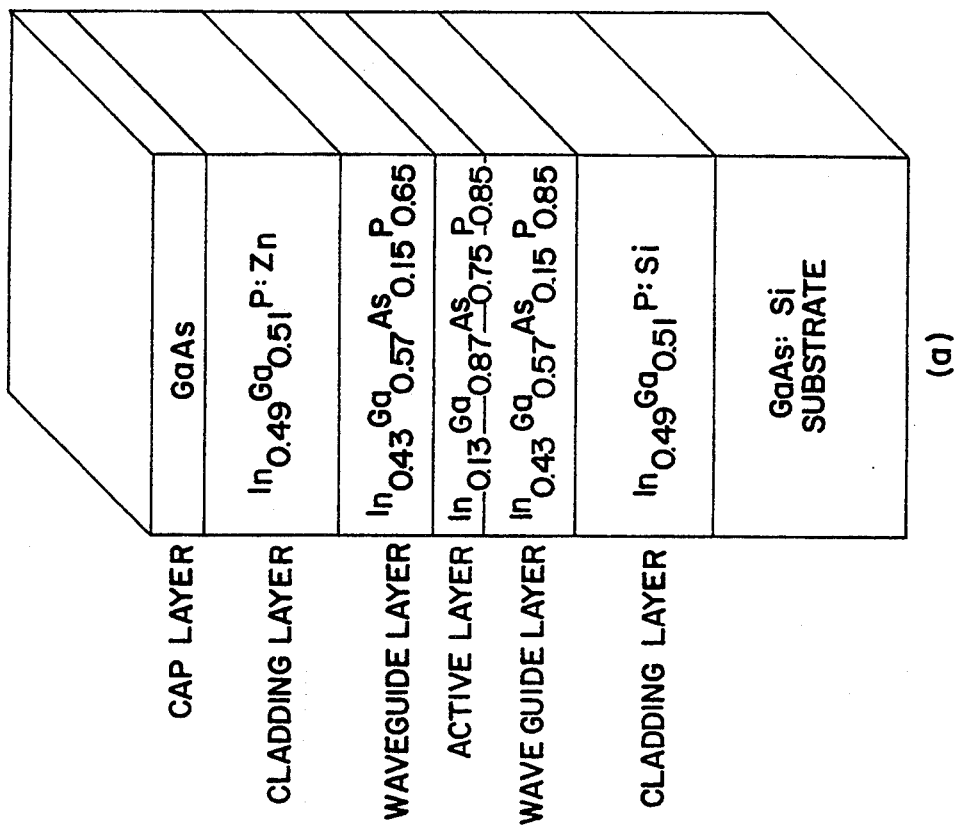
FIG. 3 is a cross-section through a GaAs substrate with an epitaxial laser structure for emission of radiation from 650→1100 nm.

Various other heterostructures were prepared using the procedure set forth above, resulting in a structure such as that set forth in FIG. 3 for $Ga_xIn_{1-x}As_yP_{1-y}$/GaAs ($0 \leq x \leq 1$ and $0 \leq y \leq 1$). In these structures, the thickness of the optical cavity layers were controlled by varying the length of time of flow of the source ingredients. In Examples 2-9, the composition of each layer was maintained at the compositions set forth in Example 1 and different total thicknesses of the optical cavity were prepared as set forth in Table 2 below.

TABLE 2

| Example | Thickness (Å) | Current Density (A/cm$^2$) | Efficiency | p-type Doping (Cap Layer) (atms/cm$^2$) |
|---|---|---|---|---|
| 2 | 9000 | 1000 | 70% | $10^{20}$ |
| 3 | 8000 | 850 | 70% | $10^{20}$ |
| 4 | 7000 | 700 | 60% | $10^{20}$ |
| 5 | 6000 | 600 | 55% | $10^{20}$ |
| 6 | 5000 | 550 | 50% | $10^{20}$ |
| 7 | 4500 | 500 | 35% | $10^{20}$ |
| 8 | 2500 | 450 | 20% | $10^{20}$ |

The resulting diode lasers have exhibited dramatically increased power levels in the 5000 Å - 1 micron range as set forth in Table 2. From the above table, it is clear that the saturation p-type doping of the confinement layer and increased thickness of the optical cavity of a double heterostructure SCH-SQW $Ga_xIn_{1-x}As_yP_{1-y}$/GaAs $0 \leq x \leq 1$ and $0 \leq y \leq 1$) results in the increased power capabilities of light emitted by the diode laser, including increased efficiency levels.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

I claim:

1. A method for the preparation of a strained layer heterostructure for a diode laser by LP-MOCVD comprising the steps of:
   a) preparing a substrate;
   b) growing, in succession, the following layers on said substrate:
      1) a first cladding layer doped with an doping agent consisting of silane or H$_2$S;
      2) a waveguide layer of $Ga_xIn_{1-x}As_yP_{1-y}$ where $0 \leq x \leq 1$ and $0 \leq y \leq 1$;
      3) an undoped active layer of $Ga_xIn_{1-x}As_yP_{1-y}$, where $0 \leq x \leq 1$ and $0 \leq y \leq 1$;
      4) a waveguide layer of $Ga_xIn_{1-x}As_yP_{1-y}$, where $0 \leq x \leq 1$ and $0 \leq y \leq 1$.
      5) a second doped cladding layer, and
   c) controlling the thickness of said active layer and said waveguide layers to total between 5000 Å and 1 micron.

2. The method of claim 1 including the step of doping said second cladding layer with Zn to a concentration of from $5 \times 10^{19}$ atoms/cm$^2$ to $10^{20}$ atoms/cm$^2$ on the surface.

3. A method for the preparation of a GaInAsP strained layer double heterostructure for use in a diode laser comprising the steps of;
   a) growing a first cladding layer;
   b) doping said first cladding layer with Si;
   c growing sequential layers of GaInAsP by metal organic chemical vapor deposition on a substrate, including an active layer between two waveguide layers;
   d controlling the growth of said active layer and said waveguide layers so that the combined thickness of said layers is between 7000 Å and 1 micron;
   e growing a second cladding layer; and
   f doping said second cladding layer with a p-type dopant to achieve a saturation of dopant on the surface of said second cladding layer.

4. The method of claim 3 including doping said first cladding layer with an n-type dopant.

5. The method of claim 3 wherein said second cladding layer is doped with Zn.

6. A method for the preparation of a strained layer heterostructure for a diode laser by LP-MOCVD comprising the steps of:
   a) preparing a heated substrate;
   b) growing, in succession, the following layers on said substrate by the controlled flow of trimethyl indium, triethyl gallium, arsine, and phosphine to said heated substrate:
      1) a first cladding layer doped with a doping agent consisting of silane or H$_2$S;
      2) a first waveguide layers of $Ga_xIn_{1-x}As_yP_{1-y}$ where $0 \leq x \leq 1$ and $0 \leq y \leq 1$;
      3) an undoped active layer of a GaInAsP composition;
      4) a second waveguide layer of $Ga_xIn_{1-x}As_yP_{1-y}$ where $0 \leq x \leq 1$ and $0 \leq y \leq 1$; and
      5) a second cladding layer, and
   controlling steps b)2), b)3), and b)4) so that the total thickness of said layers is between 5000 Å and 1 micron;
   c) doping said second cladding layer by:
      1) cooling said substrate and grown layers;
      2) terminating the flow of said trimethyl indium, triethyl gallium, arsine, and phosphine; and
      3) introducing to said second cladding layer diethyl zinc for a period of about 2-3 minutes.

7. The method of claim 6 including the step of doping said first cladding layer with Si.

8. A method for the preparation of a strained layer heterostructure for a diode laser by LP-MOCVD comprising the steps of:

a) preparing a heated substrate;
b) growing, in succession, the following layers on said substrate by the flow of trimethyl indium, triethyl gallium, arsine, and phosphine to said heated substrate:
 1) a first cladding layer;
 2) a first waveguide layer of $Ga_xIn_{1-x}As_yP_{1-y}$ where $0 \leq x \leq 1$ and $0 \leq y \leq 1$;
 3) an undoped active layer of a GaInAsP composition;
 4) a second waveguide layer similar to said first waveguide layer;
 5) a doped cladding layer, and
c) growing a cap layer of GaAs;
d) doping said cap layers by cooling said substrate and grown layers;
terminating the flow of said trimethyl indium, triethyl gallium, arsine, and phosphine;
introducing to said cooling cladding layer a dopant selected from the group consisting of silane and $H_2S$; and
e) doping said cap layer with Zn to a level of about $10^{20}$ atoms/cm$^3$.

9. The method of claim 8 wherein said step of growing the cap layer includes introducing a flow of triethyl gallium and arsine on said heated substrate.

10. The method of claim 8 wherein said step of doping said cap layer includes the step of terminating the flow of triethyl gallium and maintaining a flow of diethyl zinc and arsine while cooling said substrate to ambient.

* * * * *